United States Patent
Shin et al.

(10) Patent No.: US 9,264,024 B2
(45) Date of Patent: Feb. 16, 2016

(54) APPARATUS AND METHOD OF CORRECTING OUTPUT CHARACTERISTICS IN A POWER COMBINATION APPARATUS

(71) Applicant: Samsung Electronics Co., Ltd., Suwon-si, Gyeonggi-do (KR)

(72) Inventors: Kwan-Ho Shin, Yongin-si (KR); Yong-Sik Im, Suwon-si (KR); Young-Ju Cho, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/430,774

(22) PCT Filed: Sep. 30, 2013

(86) PCT No.: PCT/KR2013/008727
§ 371 (c)(1),
(2) Date: Mar. 24, 2015

(87) PCT Pub. No.: WO2014/051400
PCT Pub. Date: Apr. 3, 2014

(65) Prior Publication Data
US 2015/0249444 A1    Sep. 3, 2015

(30) Foreign Application Priority Data

Sep. 28, 2012  (KR) .......................... 10-2012-0109491

(51) Int. Cl.
H03L 7/00    (2006.01)
H03K 5/01   (2006.01)
H03F 3/24   (2006.01)
H03F 3/21   (2006.01)
H03K 5/00   (2006.01)

(52) U.S. Cl.
CPC .................. *H03K 5/01* (2013.01); *H03F 3/211* (2013.01); *H03F 3/24* (2013.01); *H03F 2200/153* (2013.01); *H03F 2203/21106* (2013.01); *H03K 2005/00013* (2013.01); *H03K 2005/00286* (2013.01)

(58) Field of Classification Search
None
See application file for complete search history.

(56) References Cited

U.S. PATENT DOCUMENTS

| | | | |
|---|---|---|---|
| 5,886,573 A * | 3/1999 | Kolanek | 330/10 |
| 7,953,174 B2 * | 5/2011 | Asbeck et al. | 375/295 |
| 2003/0016701 A1 * | 1/2003 | Hinson | 370/480 |
| 2006/0088124 A1 | 4/2006 | Mizuta et al. | |
| 2006/0176969 A1 * | 8/2006 | Trivedi | 375/260 |
| 2007/0054698 A1 * | 3/2007 | Ding et al. | 455/561 |
| 2007/0241814 A1 | 10/2007 | Kayano | |
| 2010/0013527 A1 * | 1/2010 | Warnick | 327/129 |
| 2010/0214018 A1 | 8/2010 | Saed | |
| 2011/0156815 A1 | 6/2011 | Kim et al. | |
| 2014/0376676 A1 * | 12/2014 | Schafferer | 375/356 |

FOREIGN PATENT DOCUMENTS

KR    10-2002-0068735 A    8/2002

* cited by examiner

*Primary Examiner* — Cassandra Cox
(74) *Attorney, Agent, or Firm* — Jefferson IP Law, LLP

(57) ABSTRACT

An apparatus and a method of correcting output characteristics in a power combination apparatus are provided. The method includes synchronizing Digital UpConverters (DUCs) included in a plurality of power amplifiers, adjusting a fine delay between signals outputted by the DUCs based on a Frequency Assignment (FA), combining fine delay-compensated signals output from the plurality of power amplifiers, and outputting the combined signal.

16 Claims, 4 Drawing Sheets

APPARATUS AND METHOD OF CORRECTING OUTPUT CHARACTERISTICS IN A POWER COMBINATION APPARATUS

CROSS-REFERENCE TO RELATED APPLICATION(S)

This application is a U.S. National Stage application under 35 U.S.C. §371 of an International application filed on Sep. 30, 2013 and assigned application number PCT/KR2013/008727, which claimed the benefit of a Korean patent application filed on Sep. 28, 2012 in the Korean Intellectual Property Office and assigned Serial number 10-2012-0109491, the entire disclosure of each of which is hereby incorporated by reference.

TECHNICAL FIELD

The present disclosure relates to an apparatus and method of correcting output characteristics by shifting the phases of a plurality of power amplifiers in a power combination apparatus.

BACKGROUND

In general, a wireless communication apparatus is provided with a power amplifier for transmission of a signal in the air. That is, a power amplifier is used to increase the distance a signal can be transmitted. Thus, the power amplifier is one of the components of a transmitter in a wireless communication apparatus and amplifies the magnitude of a signal prior to its transmission.

To increase a maximum output power capacity by a power amplifier, a divide/combine power combination apparatus is usually used. For example, the power combination apparatus divides an input signal into a plurality of signals, amplifies the plurality of signals through a plurality of power amplifiers, and combines the amplified signals, thereby achieving a maximum output power capacity.

The above information is presented as background information only to assist with an understanding of the present disclosure. No determination has been made, and no assertion is made, as to whether any of the above might be applicable as prior art with regard to the present disclosure.

SUMMARY

To maximize an output power capacity, the phase difference between signals to be combined should be minimized in a power combination apparatus. For this purpose, a plurality of power amplifiers use a common clock in the power combination apparatus.

Despite the use of the common clock by the plurality of power amplifiers, it is not easy to achieve a maximum output power capacity due to the latency and phase difference between signals input to the plurality of power amplifiers.

The power combination apparatus may search for a phase that offers the maximum output power capacity by shifting the phases of internal signals of the power amplifiers by a predetermined value each time.

However, this shifting scheme faces the problem of a too wide phase range to be searched (from 0 to 360 degrees), which may increase a processing time and load.

Aspects of the present disclosure are to address at least the above-mentioned problems and/or disadvantages and to provide at least the advantages described below. Accordingly, an aspect of the present disclosure is to provide a power combination apparatus and method that correct output characteristics in consideration of a fine delay between a plurality of power amplifiers.

Another aspect of the present disclosure is to provide a power combination apparatus and method that shift the phases of signals in a plurality of power amplifiers by monitoring a power-combined output signal.

Another aspect of the present disclosure is to provide a power combination apparatus and method that compensate for degradation of power combination characteristics caused by aging after initial correction of output characteristics.

In accordance with an aspect of the present disclosure, a method of correcting output characteristics in a power combination apparatus is provided. The method includes synchronizing Digital UpConverters (DUCs) included in a plurality of power amplifiers, adjusting a fine delay between signals outputted by the DUCs based on a Frequency Assignment (FA), combining fine delay-compensated signals output from the plurality of power amplifiers, and outputting the combined signal.

The method may further include, if a combination gain acquired from the combined signal does not satisfy a predetermined threshold, shifting a phase of an output signal of a master power amplifier being one of the plurality of power amplifiers by a predetermined value, the output signal of the master power amplifier being a signal processed by crest factor reduction to amplify the fine delay-adjusted signal. The method may further include monitoring a Voltage Standing Wave Ratio (VSWR) of each of the plurality of power amplifiers and shifting a phase of an output signal of a master power amplifier being one of the plurality of power amplifiers using a value mapped to the monitored VSWRs in a look-up table, the output signal of the master power amplifier being a signal processed by crest factor reduction to amplify the fine delay-adjusted signal.

In accordance with another aspect of the present disclosure, a power combination apparatus is provided. The power combination apparatus includes a plurality of power amplifiers, a combiner configured to combine signals output from the plurality of power amplifiers and to output the combined signal, and a controller configured to control the plurality of power amplifiers to synchronize DUCs included in the plurality of power amplifiers and adjust a fine delay between signals outputted by the DUCs based on an FA.

According to an aspect of the present disclosure, if a combination gain acquired from the combined signal does not satisfy a predetermined threshold, the controller may control a master power amplifier, being one of the plurality of power amplifiers, to shift a phase of an output signal of the master power amplifier by a predetermined value, the output signal of the master power amplifier being a signal processed by crest factor reduction to amplify the fine delay-adjusted signal.

According to an aspect of the present disclosure, the controller may monitor a VSWR of each of the plurality of power amplifiers and control a master power amplifier, being one of the plurality of power amplifiers, to shift a phase of an output signal of the master power amplifier using a value mapped to the monitored VSWRs in a look-up table, the output signal of the master power amplifier being a signal processed by crest factor reduction to amplify the fine delay-adjusted signal.

In accordance with another aspect of the present disclosure, when the outputs of a plurality of power amplifiers are combined, improved combination characteristics can be achieved. Further, since aging-caused degradation of power combination characteristics is corrected continuously, power transmission performance can be increased.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
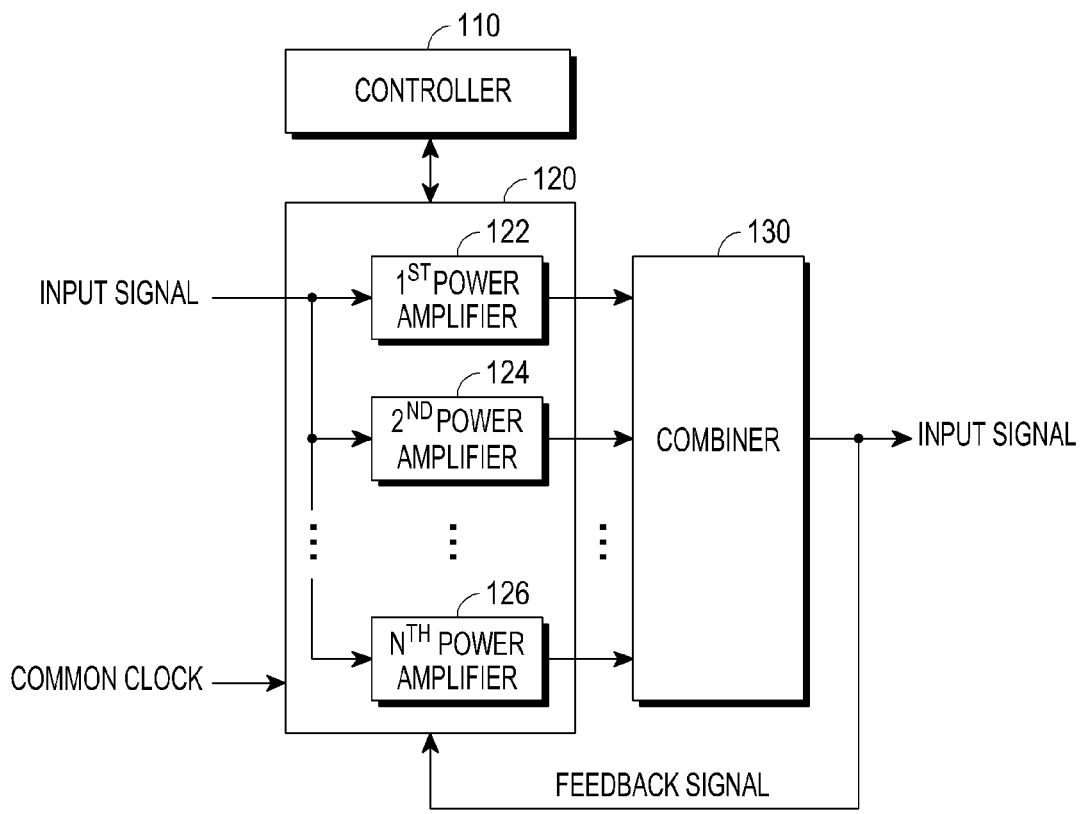
FIG. 1 is a block diagram of a power combination apparatus according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Various embodiments of the present disclosure will be provided to achieve the above-described technical aspects of the present disclosure. In various implementations, defined entities may have the same names, to which the present disclosure is not limited. Thus, various embodiments of the present disclosure can be implemented with same or ready modifications in a system having a similar technical background.

An embodiment of the present disclosure provides a method of correcting output characteristics of a power combination apparatus by synchronizing a Digital UpConverter (DUC) in each of a plurality of power amplifiers and compensating for a fine delay between the plurality of power amplifiers.

Depending on whether a combination gain of a signal output from the power combination apparatus satisfies a predetermined threshold (e.g., −2 dB), the phase of an internal signal in a power amplifier is shifted by a predetermined value or by referring to a look-up table that is based on Voltage Standing Wave Ratios (VSWRs).

After the phase of the internal signal in the power amplifier is shifted based on the combination gain and the VSWRs, fine adjustment is performed on the phase of the internal signal in the power amplifier until the VSWRs of signals output from the plurality of power amplifiers reach a target level (e.g., 3 dB).

If a specific event occurs due to aging after initial correction of the output characteristics, the power combination apparatus additionally corrects output characteristics through fine delay compensation and phase shifting. For example, the specific event may be that the VSWRs of the power amplifiers are kept at or below 12 dB for a predetermined time (e.g., 10 seconds).

The additional correction of output characteristics may be limited to use of at least one of phase shifting using the look-up table and fine phase adjustment. This is because that the combination gain of signals output from the power amplifiers is not likely to drop to a value that does not satisfy the threshold due to aging-caused degradation of output characteristics.

Various embodiments of the present disclosure will be described with reference to the attached drawings.

FIG. 1 is a block diagram of a power combination apparatus according to an embodiment of the present disclosure.

Referring to FIG. 1, the power combination apparatus includes a controller 110, a power amplification unit 120, and a combiner 130. The power amplification unit 120 includes n power amplifiers 122, 124, and 126.

The n power amplifiers 122, 124, and 126 of the power amplification unit 120 amplify the same input signal using a common clock. Even though the n power amplifiers 122, 124, and 126 amplify the same signal using the common clock, a fine delay occurs between internal signals of the n power amplifiers 122, 124, and 126. That is, despite the use of the common clock, a fine delay occurs between signals input to the n power amplifiers 122, 124, and 126. The fine delay causes a phase error between signals output from the n power amplifiers 122, 124, and 126, thus making it difficult to achieve a maximum output power capacity in the power combination apparatus.

One of the causes of the fine delay is a synchronization between components of the n power amplifiers 122, 124, and 126, particularly DUCs of the n power amplifiers 122, 124, and 126. Therefore, the n power amplifiers 122, 124, and 126 synchronize the internal DUCs during initial correction of output characteristics. For example, the DUCs may be reset to be synchronized with one another.

After the synchronization of the DUCs, the n power amplifiers 122, 124, and 126 compensate for the fine delay between the input signals. For example, each of the n power amplifiers 122, 124, and 126 may include a buffer and compensate for the fine delay by adjusting an output timing of the buffer.

The n power amplifiers 122, 124, and 126 receive feedback of their output signals and an output signal of the power combination apparatus, and shift the phases of the internal signals based on the feedback output signals. For example, a minimum number of power amplifiers may perform phase shifting, instead of all of the n power amplifiers 122, 124, and 126. A power amplifier that performs phase shifting will be referred to as a master power amplifier.

If the power amplification unit 120 includes two power amplifiers, only one of the power amplifiers shifts the phase of an internal signal. However, even though all the power amplifiers of the power amplification unit 120 perform phase shifting, the same purpose of correcting output characteristics can be achieved.

The master power amplifier shifts the phase of an internal signal in a plurality of operations. For example, the plurality of operations may include a primary phase shifting operation based on the combination gain of a signal output from the power combination apparatus, a secondary phase shifting operation based on the VSWR of each power amplifier, and a tertiary phase shifting operation through fine adjustment.

In the primary phase shifting operation, the master power amplifier shifts the phase of an internal signal by a predetermined value (e.g., 180 degrees) based on the combination gain of a signal output from the power combination apparatus. For example, if the combination gain of the signal output from the power combination apparatus is −2 dB or lower, the master power amplifier shifts the phase of the internal signal by 180 degrees.

In the secondary phase shifting operation, the master power amplifier shifts the phase of the internal signal by a value defined in a look-up table in correspondence with the VSWR of each of the n power amplifiers 122, 124, and 126. The secondary phase shifting operation may be performed simultaneously in all of the n power amplifiers 122, 124, and 126 including the master power amplifier.

In the tertiary phase shifting operation, the master power amplifier shifts the phase of the internal signal by a fine value each time until the VSWR of an output signal of each of the n power amplifiers 122, 124, and 126 reaches a target level (e.g., 15 dB) or above. Upon completion of the tertiary phase shifting operation, the output signal of the power combination apparatus has a target combination gain of 3 dB as an output characteristic. The tertiary phase shifting operation may be performed a predetermined number of times or fewer times.

If aging (e.g., passing of time) changes output characteristics after the above initial correction of output characteristics, the master power amplifier corrects the changed output characteristics. That is, upon generation of a predetermined event, the master amplifier performs fine delay compensation and at least one of the secondary and tertiary phase shifting operations. The event is generated when at least one of the VSWRs of the n power amplifiers 122, 124, and 126 is kept at or below a threshold (e.g., 12 dB) for a predetermined time (e.g., 10 seconds).

The controller 110 provides overall control to correct output characteristics in the power amplification unit 120. That is, the controller 110 controls fine delay compensation and the phase shifting operations of the master power amplifier as well as DUC synchronization in the n power amplifiers 122, 124, and 126 of the power amplification unit 120 in order to correct output characteristics.

For example, the controller 110 controls the n power amplifiers 122, 124, and 126 to synchronize the DUCs and compensate for a fine delay between signals outputted by the DUCs based on a Frequency Assignment (FA).

The controller 110 controls the master power amplifier for the primary, secondary, and tertiary phase shifting operations.

For example, for the primary phase shifting operation, the controller 110 determines whether the combination gain of a signal output from the power combination apparatus satisfies a predetermined threshold. If the combination gain does not satisfy the threshold, the controller 110 controls the master power amplifier to shift the phase of an internal signal of the master power amplifier by a preset value.

For the secondary phase shifting operation, the controller 110 controls the master power amplifier to shift the phase of the internal signal of the master power amplifier using a phase value mapped to the VSWRs of signals output from the n power amplifiers 122, 124, and 126 in the look-up table.

For the tertiary phase shifting operation, the controller 110 controls each of the n power amplifiers 122, 124, and 126 to perform fine adjustment on the phase of an internal signal of the power amplifier until the VSWR of the power amplifier reaches a target level.

Therefore, the controller 110 may determine a combination gain from an output signal of the power combination apparatus or determine the VSWR of a signal output from each of the n power amplifiers 122, 124, and 126. To control the secondary phase shifting operation, the controller 110 should be authorized to access the look-up table that maps phase shift values to VSWRs. The look-up table may be included in the controller 110 or recorded to an external recording medium (not shown) accessible to the controller 110.

The combiner 130 combines signals received from the n power amplifiers 122, 124, and 126 of the power amplification unit 120 and outputs the combined signal.

Figure 2:
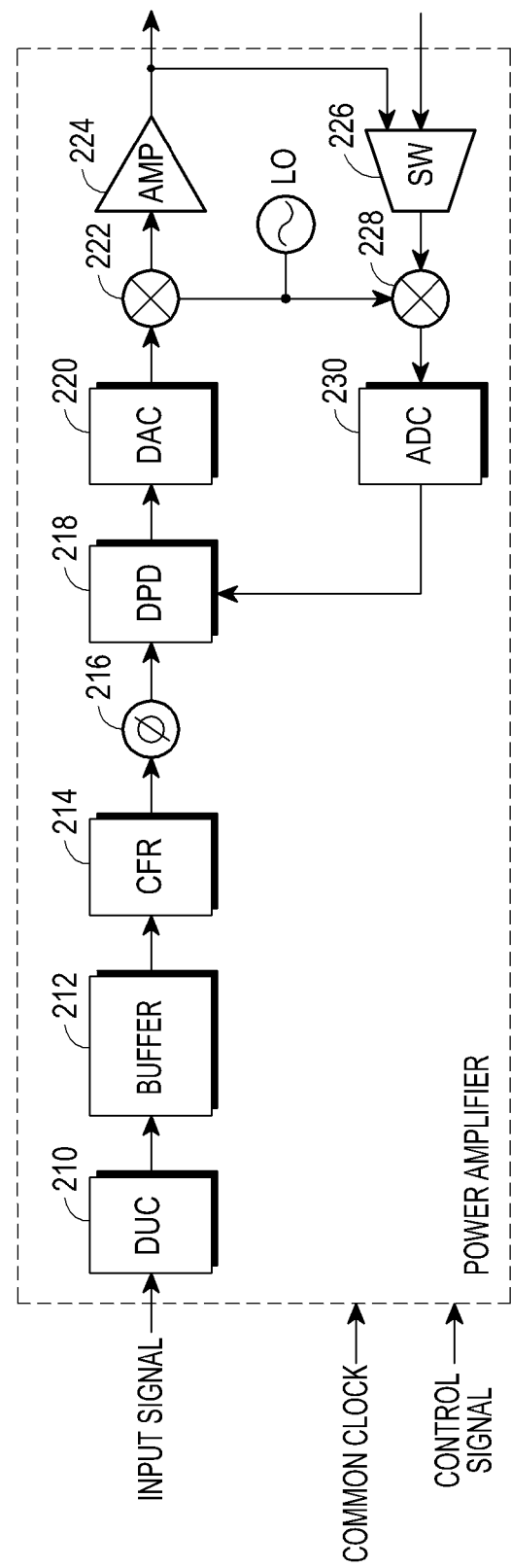
FIG. 2 is a block diagram of a power amplifier, such as the power amplifier illustrated in FIG. 1, according to an embodiment of the present disclosure.

FIG. 2 is a block diagram of a power amplifier, such as the power amplifier illustrated in FIG. 1, according to an embodiment of the present disclosure. While the configuration illustrated in FIG. 2 is commonly applicable to the n power amplifiers 122, 124, and 126 illustrated in FIG. 1, the following description is given in the context of a master power amplifier.

Referring to FIG. 2, the power amplifier receives an input signal, a common clock, a control signal, and a feedback signal. The control signal is received from the controller 110 illustrated in FIG. 1 and the feedback signal is an output signal of the power combination apparatus.

The power amplifier includes a DUC 210, a buffer 212, a Crest Factor Reducer (CFR) 214, a phase rotator 216, a Digital Pre-Distorter (DPD) 218, a Digital-to-Analog Converter (DAC) 220, a first mixer 222, an Amplifier (AMP) 224, a second mixer 228, a Local Oscillator (LO), and an Analog-to-Digital Converter (ADC) 230.

The DUC 210 upconverts an input baseband signal to an Intermediate Frequency (IF) signal. The DUC 210 includes a plurality of Numerically Controller Oscillators (NCOs). Each NCO generates a carrier frequency for upconverting the input baseband signal to the IF signal based on an FA.

The DUC 210 is synchronized with the DUCs of the other power amplifiers by a control signal during initial output characteristic correction. For example, as the DUC 210 is reset, the DUC 210 may be synchronized with the DUCs of the other power amplifiers.

The buffer 212 buffers the signal received from the DUC 210 and outputs the buffered signal in response to a control signal. That is, the buffer 212 compensates for a fine delay between the signal output from the DUC 210 and a signal output from the DUC of another power amplifier by a buffering time indicated by the control signal. That is, the buffer 212 may output the buffered signal simultaneously with a signal output from the DUC of another power amplifier according to the control signal to the CFR 214.

The CFR 214 derives a maximum output power by intelligently limiting a maximum waveform amplitude of an input signal of the power amplifier. The phase rotator 216 performs the primary and tertiary phase shifting operations on the signal received from the CFR 214 in the manners described before.

The DPD 218 distorts the phase-shifted signal received from the phase rotator 216, taking into account the propagation characteristics of the power amplifier, so that the power amplifier may perform linearly. As a result, the signal distortion may be nullified by characteristics of the power amplifier.

The DAC 220 converts the digital signal received from the DPD 218 to an analog signal. The first mixer 222 mixes the analog signal received from the DAC 220 with a frequency received from the LO. The AMP 224 amplifies the mixed signal received from the first mixer 222.

The signal output from the AMP 224 is provided to the combiner 130 illustrated in FIG. 1 and a switch 226. The switch 226 selectively outputs one of the signal received from the AMP 224 and an output signal of the power combination apparatus.

The second mixer 228 mixes the signal received from the switch 226 with a frequency received from the LO. The ADC 230 converts the analog signal received from the second mixer 228 to a digital signal and outputs the digital signal to the DPD 218.

Figure 3:
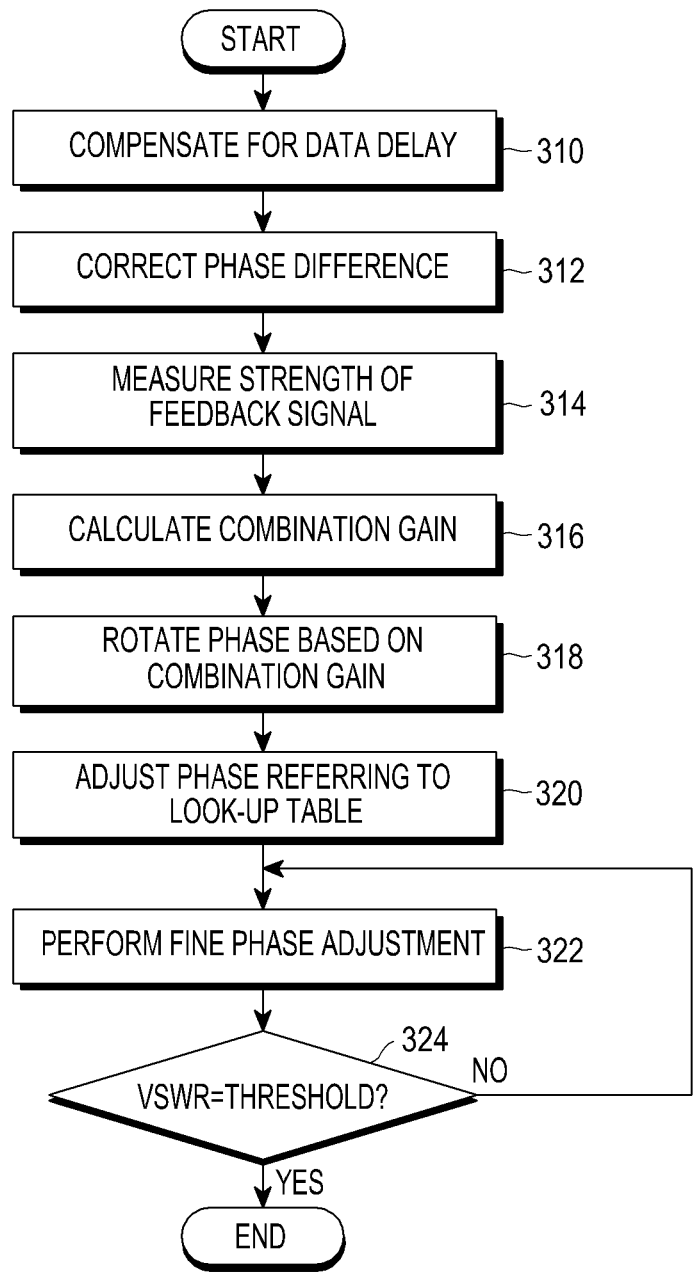
FIG. 3 is a flowchart illustrating a control operation of correcting output characteristics in a power combination apparatus according to an embodiment of the present disclosure.

FIG. 3 is a flowchart illustrating a control operation of correcting output characteristics in a power combination apparatus according to an embodiment of the present disclosure.

Referring to FIG. 3, the power combination apparatus synchronizes DUCs of a plurality of power amplifiers included in the power combination apparatus at operation 310. The synchronization is performed to prevent a fine delay between input signals caused by the DUCs.

The power combination apparatus compensates for a fine delay between output signals of the synchronized DUCs of the plurality of power amplifiers at operation 312. For example, the fine delay is compensated for by aligning signal output timings with one another using buffers at the output ends of the DUCs in the plurality of power amplifiers.

The power combination apparatus measures the strength of its output signal, that is, a feedback signal at operation 314. The power combination apparatus calculates a combination gain by comparing the strength of the feedback signal and a signal output from a CFR at operation 316. For example, the combination gain may be calculated by dividing the strength of the feedback signal by the strength of the signal output from the CFR.

The power combination apparatus performs a primary phase shifting operation on a signal output from a CFR of a master power amplifier, taking into account the calculated combination gain at operation 318. If the combination gain of the feedback signal does not satisfy a predetermined threshold, the phase of the signal output from the CFR of the master power amplifier is shifted by a predetermined phase value (e.g., 180 degrees). For example, if the combination gain of the signal output from the power combination apparatus is equal to or lower than a threshold, −2 dB, the master power amplifier shifts the phase of its internal signal by 180 degrees.

On the other hand, if the combination gain of the feedback signal satisfies the predetermined threshold, the primary phase shifting operation of phase rotation based on the combination gain is not performed.

If the combination gain of the feedback signal satisfies the predetermined threshold or the primary phase shifting operation is completed, the power combination apparatus performs a phase shifting operation referring to a look-up table (i.e., the secondary phase shifting operation) at operation 320. During the secondary phase shifting operation, the master power amplifier checks a phase shift value mapped to the VSWRs of signals output from the plurality of power amplifiers in the look-up table. The phase shift value corresponds to a phase difference between the plurality of power amplifiers. The phase of the master power amplifier is shifted by the checked phase shift value. The secondary phase shifting operation may be performed simultaneously in all of the power amplifiers including the master power amplifier.

The power combination apparatus adjusts the phase of the internal signal of the master power amplifier by a fine value, each time, until the VSWRs of the plurality of power amplifiers reach a target level (e.g., 15 dB) or above at operation 322. Since the VSWRs of the plurality of power amplifiers are equal to or larger than the target level (e.g., 15 dB) by the tertiary phase shifting operation, the output signal of the power combination apparatus has a target combination gain of 3 dB.

The power combination apparatus sets a maximum number of tertiary phase shifting operations, that is, a reference value (e.g., 15 times) and achieves an intended target combination gain within the maximum number of tertiary phase shifting operations at operation 324. If the VSWRs of all of the power amplifiers exceed 15 dB before the maximum number of tertiary phase shifting operations is reached, the tertiary phase shifting operation is discontinued.

Figure 4:
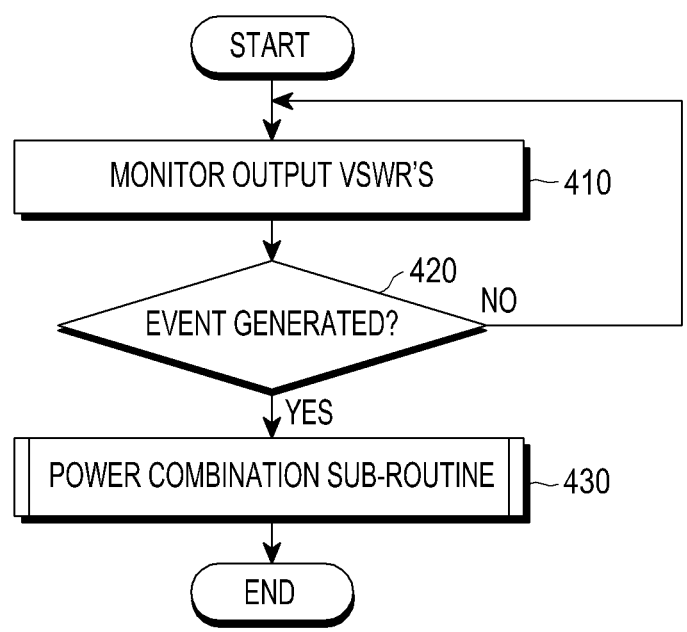
FIG. 4 is a flowchart illustrating a control operation of compensating for degradation of power combination characteristics caused by aging in a power combination apparatus according to an embodiment of the present disclosure.

FIG. 4 is a flowchart illustrating a control operation of compensating for degradation of power combination characteristics caused by aging in a power combination apparatus according to an embodiment of the present disclosure. The control operation of FIG. 4 is performed to compensate for an aging-caused change in stable power combination characteristics after the initial correction for the stable power combination characteristics in FIG. 3.

Referring to FIG. 4, the power combination apparatus monitors the VSWRs of signals output from the plurality of power amplifiers at a predetermined interval or at a specific time point at operation 410. The power combination apparatus determines whether a predetermined event has been generated based on the VSWR monitoring at operation 420. For example, the event may be a state where at least one of the VSWRs of the plurality of power amplifiers is kept at or below a threshold level (e.g., 12 dB) for a predetermined time (e.g., 10 seconds). Upon generation of the event, the power combination apparatus outputs an alarm to indicate a power combination error.

Upon generation of the autonomous alarm warning of a power combination error, the power combination apparatus performs a power combination sub-routine at operation 430. The power combination sub-routine adjusts a fine delay by controlling a master power amplifier and performs a phase shifting operation once, so that the power combination apparatus may improve the power combination characteristics again. For example, the phase shifting operation in the power combination sub-routine may be performed by at least one of a phase shift using a look-up table, that is, the secondary phase shifting operation and fine phase adjustment, that is, the tertiary phase shifting operation.

It will be understood that the various embodiments of the present disclosure can be implemented in hardware, software, or a combination thereof The software may be stored in a volatile or non-volatile memory device like a Read Only Memory (ROM) irrespective of whether data is deletable or rewritable, in a memory like a Random Access Memory (RAM), a memory chip, a device, or an integrated circuit, or in a storage medium to which data can be recorded optically or magnetically and from which data can be read by a machine (e.g., a computer), such as a Compact Disk (CD), a Digital Versatile Disc (DVD), a magnetic disk, or a magnetic tape.

Further, the various embodiments of the present disclosure can be implemented in a computer or portable terminal that has a controller and a memory, and the memory is an example of a machine-readable storage medium suitable for storing a program or programs including commands to implement the various embodiments of the present disclosure. Accordingly, the present disclosure includes a program having a code for implementing the apparatuses or methods defined by the claims and a storage medium readable by a machine (e.g., a computer) that stores the program.

The apparatus and method of correcting output characteristics can receive the program from a program providing device connected by cable or wirelessly and store it. The program providing device may include a program including commands to implement the various embodiments of the present disclosure, a memory for storing information required for the various embodiments of the present disclosure, a communication module for communicating with the mobile device by cable or wirelessly, and a controller for transmitting the program to the mobile device automatically or upon request of the device.

While the present disclosure has been shown and described with reference to various embodiments thereof, it will be understood by those skilled in the art that various changes in form and details may be made therein without departing from the spirit and scope of the present disclosure as defined by the appended claims and their equivalents.

The invention claimed is:

1. A method of correcting output characteristics in a power combination apparatus, the method comprising:
    synchronizing digital up-converters (DUCs) included in a plurality of power amplifiers;
    adjusting a fine delay between signals outputted from the DUCs based on a frequency assignment (FA);
    combining fine delay-compensated signals output from the plurality of power amplifiers; and
    outputting the combined signal.

2. The method of claim 1, further comprising, if a combination gain acquired from the combined signal does not satisfy a predetermined threshold, shifting a phase of an output signal of a master power amplifier being one of the plurality of power amplifiers by a predetermined value, the output signal of the master power amplifier being a signal processed by crest factor reduction to amplify the fine delay-adjusted signal.

3. The method of claim 1, further comprising monitoring a voltage standing wave ratio (VSWR) of each of the plurality of power amplifiers and shifting a phase of an output signal of a master power amplifier being one of the plurality of power amplifiers using a value mapped to the monitored VSWRs in a look-up table, the output signal of the master power amplifier being a signal processed by crest factor reduction to amplify the fine delay-adjusted signal.

4. The method of claim 2, further comprising fine-adjusting phases of crest factor-reduced output signals until the VSWR of each of the output signals of the plurality of power amplifiers reaches a target level.

5. The method of claim 1, wherein the fine delay adjustment comprises adjusting the fine delay by buffering the signals processed based on the FA by the DUCs.

6. The method of claim 4, further comprising, upon generation of a predetermined event based on monitoring of the VSWRs of the plurality of power amplifiers, performing at least one of a phase shifting operating using the look-up table and the fine-phase adjustment after the fine delay is compensated.

7. The method of claim 6, wherein the event is generated when at least one of the VSWRs of the plurality of power amplifiers is kept at or below a threshold level for a predetermined time.

8. The method of claim 3, further comprising fine-adjusting phases of crest factor-reduced output signals until the VSWR of each of the output signals of the plurality of power amplifiers reaches a target level.

9. A power combination apparatus comprising:
    a plurality of power amplifiers;
    a combiner configured to combine signals output from the plurality of power amplifiers and to output the combined signal; and
    a controller configured to control the plurality of power amplifiers to synchronize digital up-converters (DUCs) included the plurality of power amplifiers and adjust a fine delay between signals outputted by the DUCs based on a frequency assignment (FA).

10. The power combination apparatus of claim 9, wherein if a combination gain acquired from the combined signal does not satisfy a predetermined threshold, the controller controls a master power amplifier being one of the plurality of power amplifiers to shift a phase of an output signal of the master power amplifier by a predetermined value, the output signal of the master power amplifier being a signal processed by crest factor reduction to amplify the fine delay-adjusted signal.

11. The power combination apparatus of claim 9, wherein the controller monitors a voltage standing wave ratio (VSWR) of each of the plurality of power amplifiers and controls a master power amplifier being one of the plurality of power amplifiers to shift a phase of an output signal of the master power amplifier using a value mapped to the monitored VSWRs in a look-up table, the output signal of the master power amplifier being a signal processed by crest factor reduction to amplify the fine delay-adjusted signal.

12. The power combination apparatus of claim 10, wherein the controller controls the plurality of power amplifiers to fine-adjust phases of crest factor-reduced output signals until the VSWRs of output signals of the plurality of power amplifiers reach a target level.

13. The power combination apparatus of claim 9, wherein each of the plurality of power amplifiers comprises:
    a buffer configured to buffer a signal processed based on an FA by a DUC of the power amplifier under control of the controller, for the fine delay compensation; and
    a phase rotator configured to shift the phase of a crest factor-reduced output signal or to fine-adjust the phase of the crest factor-reduced output signal under control of the controller.

14. The power combination apparatus of 12, wherein upon generation of a predetermined event based on monitoring of the VSWRs of the plurality of power amplifiers, the controller controls the plurality of power amplifiers to perform at least one of a phase shifting operating using the look-up table and the fine-phase adjustment after the fine delay is compensated.

15. The power combination apparatus of claim 14, wherein the event is generated when at least one of the VSWRs of the plurality of power amplifiers is kept at or below a threshold level for a predetermined time.

16. The power combination apparatus of claim 11, wherein the controller controls the plurality of power amplifiers to fine-adjust phases of crest factor-reduced output signals until the VSWRs of output signals of the plurality of power amplifiers reach a target level.

* * * * *